US010337294B2

(12) United States Patent
Ben et al.

(10) Patent No.: US 10,337,294 B2
(45) Date of Patent: Jul. 2, 2019

(54) RESERVOIR PERMEABILITY UPSCALING

(71) Applicants: Yuxing Ben, Houston, TX (US); Tobias Hoeink, Houston, TX (US)

(72) Inventors: Yuxing Ben, Houston, TX (US); Tobias Hoeink, Houston, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 540 days.

(21) Appl. No.: 14/872,539

(22) Filed: Oct. 1, 2015

(65) Prior Publication Data
US 2017/0096880 A1 Apr. 6, 2017

(51) Int. Cl.
E21B 41/00 (2006.01)
E21B 7/00 (2006.01)
E21B 43/20 (2006.01)
E21B 47/022 (2012.01)
E21B 43/00 (2006.01)
E21B 43/26 (2006.01)

(52) U.S. Cl.
CPC ............ E21B 41/0092 (2013.01); E21B 7/00 (2013.01); E21B 43/00 (2013.01); E21B 43/20 (2013.01); E21B 43/26 (2013.01); E21B 47/022 (2013.01)

(58) Field of Classification Search
CPC ........ E21B 41/0092; E21B 7/00; E21B 43/20; E21B 43/22; E21B 43/00; E21B 21/08; G06F 17/50; G06F 17/5018; G06N 3/0427
USPC .............................. 703/10; 166/52
See application file for complete search history.

(56) References Cited

U.S. PATENT DOCUMENTS

| 6,023,656 A | 2/2000 | Cacas et al. |
| 2005/0015231 A1* | 1/2005 | Edwards ................. E21B 49/00 703/10 |
| 2008/0133186 A1 | 6/2008 | Li et al. |
| 2009/0125239 A1* | 5/2009 | Niemeyer ............ G01N 24/081 702/11 |

(Continued)

FOREIGN PATENT DOCUMENTS

WO 2012015517 A1 2/2012

OTHER PUBLICATIONS

International Search Report and the Written Opinion of the International Searching Authority, or the Declaration; PCT/US2016/054131; dated Jan. 2, 2017; 12 pages.

(Continued)

Primary Examiner — Dzung Tran
(74) Attorney, Agent, or Firm — Cantor Colburn LLP

(57) ABSTRACT

A method for estimating a permeability of an earth formation includes: receiving a discrete fracture network (DFN) of the earth formation; representing the DFN as one or more volume sections, each volume section having a plurality of boundaries; identifying fractures that are connected to each other and lead from a first boundary in the plurality of boundaries to a second boundary in the plurality of boundaries to provide one or more flow paths for each volume section; applying Oda's method to the connected fractures making up the one or more flow paths to estimate the permeability of the earth formation along the one or more flow paths for each volume section to provide a permeability value for each volume section; and performing an action related to the earth formation using the permeability value for each volume section and an apparatus related to the action.

12 Claims, 7 Drawing Sheets

(56) References Cited

U.S. PATENT DOCUMENTS

| | | | |
|---|---|---|---|
| 2010/0155142 A1* | 6/2010 | Thambynayagam | E21B 44/00 175/61 |
| 2010/0185427 A1* | 7/2010 | Tilke | E21B 43/00 703/10 |
| 2012/0116740 A1 | 5/2012 | Fourno et al. | |
| 2013/0054207 A1 | 2/2013 | Souche et al. | |
| 2013/0096900 A1* | 4/2013 | Usadi | G06F 17/5018 703/10 |
| 2013/0340997 A1 | 12/2013 | Zupanick | |
| 2014/0076543 A1 | 3/2014 | Ejofodomi et al. | |
| 2014/0372095 A1 | 12/2014 | Van Der Zee et al. | |
| 2016/0215594 A1* | 7/2016 | Hoeink | E21B 41/0092 |
| 2017/0175507 A1 | 6/2017 | Hoeink | |
| 2017/0268332 A1 | 9/2017 | Hoeink | |

OTHER PUBLICATIONS

International Search Report and the Written Opinion of the International Searching Authority; PCT/US2017/022894; Korean Intellectual Property Office; dated Jun. 8, 2017; 9 pages.

Oda, M.,"Permeability Tensor for Discontinuous Rock Masses.", Geotechnique, vol. 35, No. 4, pp. 483-495, Dec. 1985.

Salimi, et al.; Upscaling of Fractured Oil Reservoirs Using Homogenization Including Non-Equilibrium Capillary Pressure and Relative Permeability; 2012; Retrieved from the internet; URL: https://www.researchgate.net/publication/254903947_Upscaling_of_Fractured_Oil_Reservoirs_Using_Homogenization_including_Non-equilibrium_Capillary_Pressure; 23 pages.

Ahmed Eifeel, M; Static and Dynamic Assessment of DFN Permeability Upscaling (EAGE Annual Conference & Exhibition), Jun. 2012, 16 pages.

Al-Hadrami, Hamoud & Teufel, L.W. (2000). Influence of Permeability Anisotropy and Reservoir Heterogeneity on Optimization of Infill Drilling in Naturally Fractured Tight-Gas Mesaverde Sandstone Reservoirs, San Juan Basin. 10.2523/60295-MS; 12 pages.

Factoring Anisotropy into Well Design, Oilfield Review, vol. 2, Issue 4 (1990); 10 pages.

He, Ji & Chen, Sheng-hong & Shahrour, Isam. (2013). Numerical estimation and prediction of stress-dependent permeability tensor for fractured rock masses. Int'l Journal of Rock Mechanics & Mining Sciences. 59. 70-79. 10.1016/i.ijrmms.2012.12.001.

Teimoori, Ahmed & Chen, Zhixi & S. Rahman, Sheik & Tran, T. (2005). Effective Permeability Calculation Using Boundary Element Method in Naturally Fractured Reservoirs. Petroleum Science and Technology. 23. 693-709.10.1081/LFT-200033029.

* cited by examiner

RESERVOIR PERMEABILITY UPSCALING

BACKGROUND

Boreholes are drilled into earth formations having reservoirs of hydrocarbons in order to extract the hydrocarbons through the boreholes to the surface. Selecting a location at which to drill a borehole is largely dependent on the permeability of the earth formation or ability to flow fluids through the pores and fractures of the earth formation. Numerical computational approaches have been widely used to simulate fractured reservoirs. Typically, these methods are computationally time intensive. Hence, methods to accurately compute reservoir permeability using less time would be well received in the hydrocarbon production industry.

BRIEF SUMMARY

Disclosed is a method for estimating a permeability of an earth formation of interest. The method includes: receiving a discrete fracture network (DFN) of the earth formation of interest, the DFN comprising a location, an orientation, and a size of fractures represented in the earth formation of interest; representing the DFN as one or more volume sections, each volume section comprising a plurality of boundaries; identifying fractures that are connected to each other and lead from a first boundary in the plurality of boundaries to a second boundary in the plurality of boundaries to provide one or more flow paths for each volume section; applying Oda's method to the connected fractures making up the one or more flow paths to estimate the permeability of the earth formation of interest along the one or more flow paths for each volume section to provide a permeability value for each volume section; and performing an action related to the earth formation of interest using the permeability value for each volume section and an apparatus related to the action; wherein the receiving, representing, identifying and applying are performed using a processor.

Also disclosed is a system for estimating a permeability of an earth formation of interest. The system includes a memory having computer readable instructions and a processor for executing the computer readable instructions. The computer readable instructions include: receiving a discrete fracture network (DFN) of the earth formation of interest, the DFN comprising a location, an orientation, and a size of fractures represented in the earth formation of interest; representing the DFN as one or more volume sections, each volume section comprising a plurality of boundaries; identifying fractures that are connected to each other and lead from a first boundary in the plurality of boundaries to a second boundary in the plurality of boundaries to provide one or more flow paths for each volume section; applying Oda's method to the connected fractures making up the one or more flow paths to estimate the permeability of the earth formation of interest along the one or more flow paths for each volume section to provide a permeability value for each volume section; and performing an action related to the earth formation of interest using the permeability value for each volume section and an apparatus related to the action.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method presented herein by way of exemplification and not limitation with reference to the figures.

Disclosed is a method for estimating a permeability of an earth formation of interest. The method is an analytical method and thus is less computational time intensive than conventional numerical computational methods. Once the permeability is estimated, a hydrocarbon recovery action such as drilling a new well at a selected location optimized for hydrocarbon recovery can be implemented.

Dual porosity and dual permeability approaches have been used widely in the reservoir simulation of fractured reservoirs. The basic input for such reservoir simulators requires both the equivalent fracture permeability and matrix permeability. For a fractured reservoir whose characteristic length scale is less than the size of the computation cell, a process called upscaling is often used in order to obtain the equivalent permeability of each cell. Upscaling techniques include an analytical method proposed by M. Oda (see Oda, M., 1985, "Permeability Tensor for Discontinuous Rock Masses.", Geotechnique, Vol. 35, pp. 483-495) and a range of numerical methods with different applied boundary conditions.

Oda's method is an analytical method and hence it is fast. However, it neglects the connectivity between fractures and is not valid for less connected discrete fracture networks (DFN). Numerical methods for calculating permeability on the other hand depend on the boundary conditions across the cell, and require more computation time than Oda's method.

An improved or modified Oda's approach or method as disclosed herein requires less computation power than numerical methods but considers the connectivity of the DFN for improved accuracy.

Figure 1:
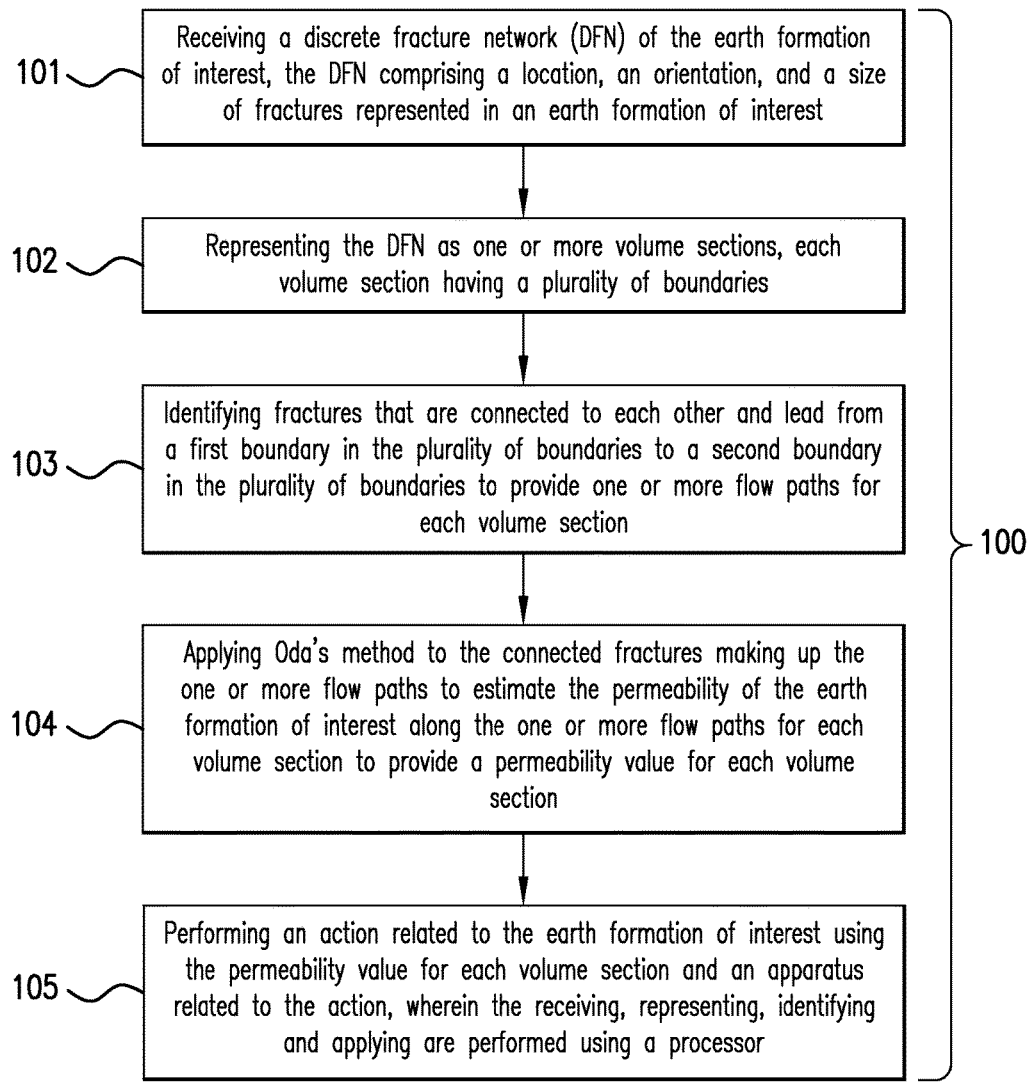
FIG. 1 is a flow chart for a method for estimating a permeability of an earth formation of interest.
Figure 2:
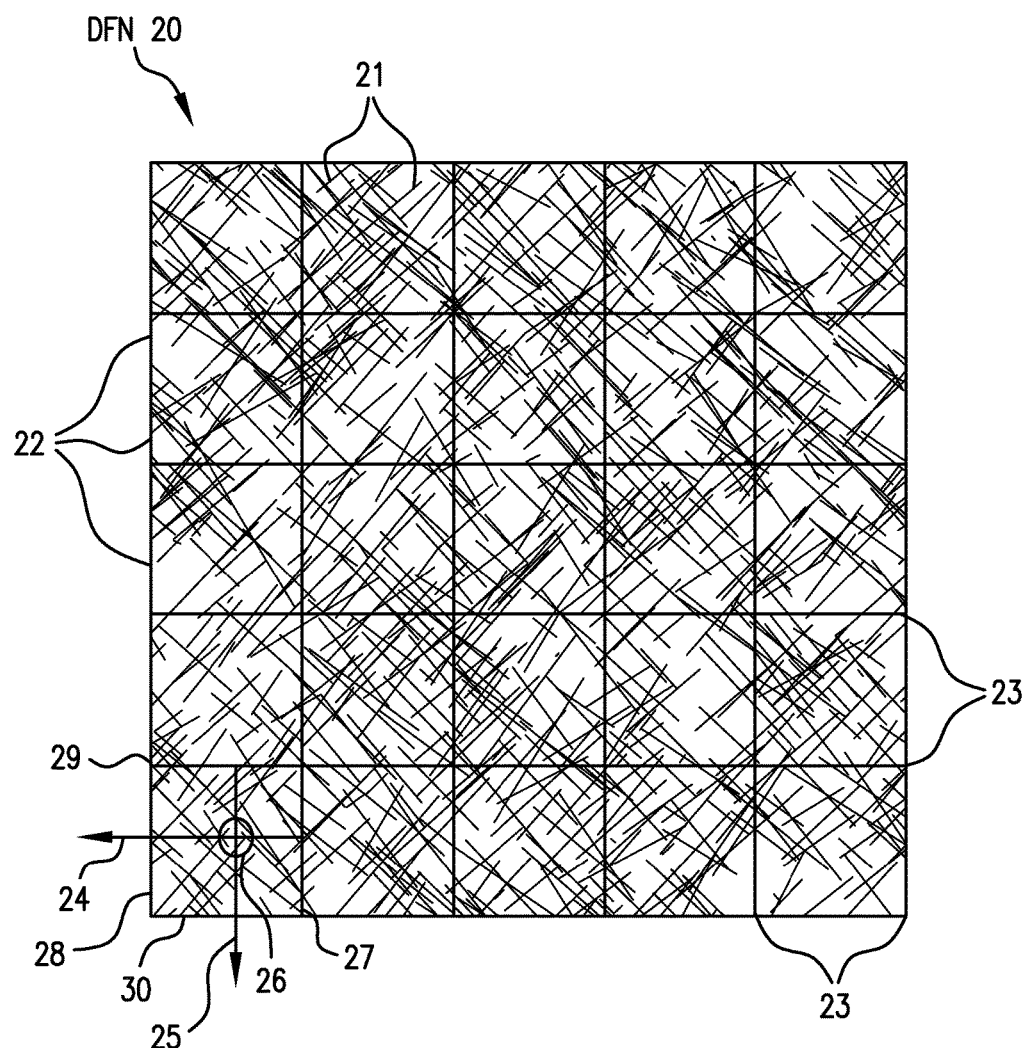
FIG. 2 depicts aspects of a discrete fracture network divided into a set of rectangular cuboids.

FIG. 1 is a flow chart for a method 100 for estimating a permeability of an earth formation of interest. The term "earth formation of interest" may relate to an entire formation or reservoir or a portion of a formation or reservoir. Block 101 calls for obtaining a discrete fracture network (DFN) of the earth formation of interest, the DFN having a location, an orientation, and a size of fractures represented in the earth formation of interest. A DFN is a set of fractures that forms a representation out of a large set of possible representations, all of which comply with a set of characteristics, such as average and standard deviations of fracture orientation, length, height, and aperture (width). A DFN may hold connectivity information, i.e. information such as which fracture is connected to which other fracture. It is worth noting that a DFN does not necessarily correlate one-to-one to an existing fracture network in the subsurface. That is, the DFN may not describe existing fractures, but may only describe fracture characteristics in some average or macro sense. FIG. 2 illustrates a two-dimensional representation of a DFN 20 having a plurality of fractures 21 shown as fracture planes. Each of the fractures has a location, orientation (i.e., direction of fracture plane), and size (i.e., length, height and width or aperture where the aperture generally has a much smaller dimension than length and/or height).

Figure 3A:
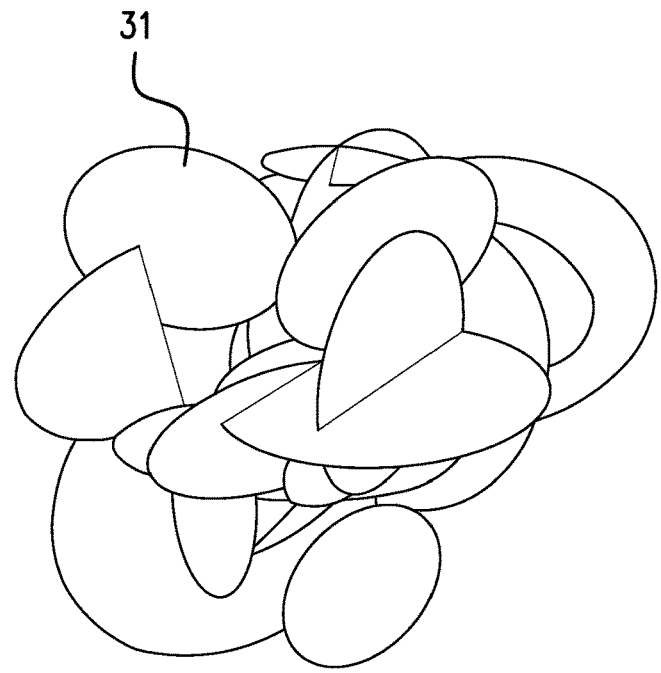
FIGS. 3A and 3B, collectively referred to as FIG. 3, depict aspects of a network of ellipsoid-shaped fractures that are cropped into a rectangular cuboid.
Figure 3B:
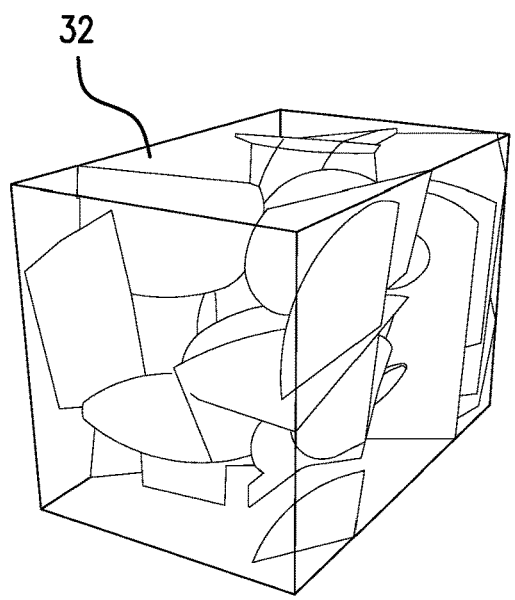
Figure 4B:
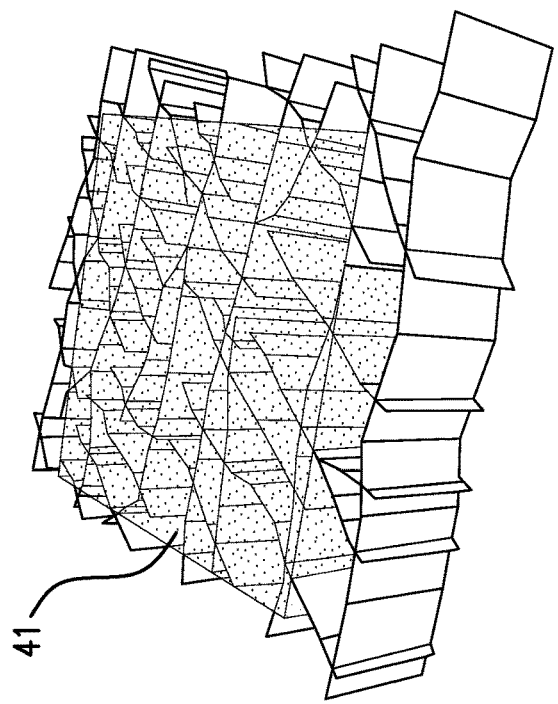
FIGS. 4A-4C, collectively referred to as FIG. 4, depict aspects of a network of rectangular fractures that are cropped into a rectangular cuboid.
Figure 4A:
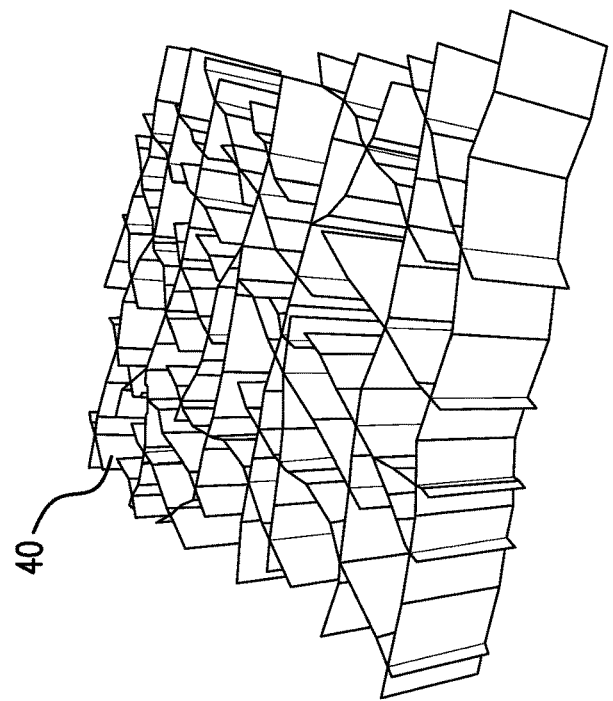
Figure 4C:
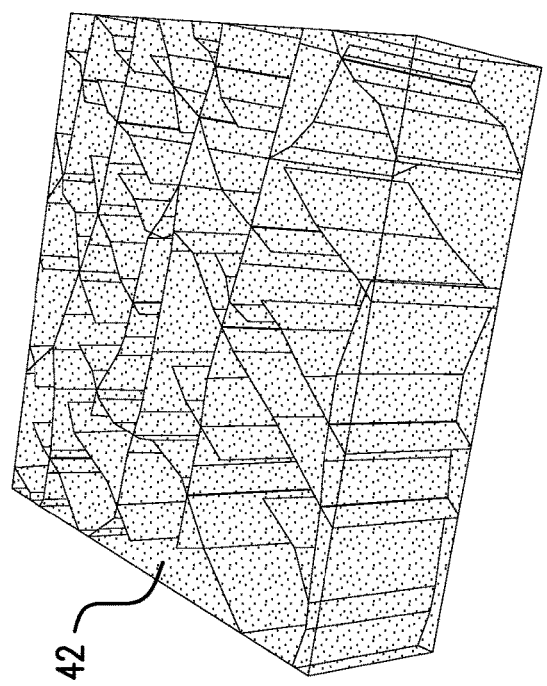

Referring to FIG. 1, block 102 calls for representing the DFN as one or more volume sections, each volume section comprising a plurality of boundaries. In one or more embodiments, the volume sections are rectangular cuboids having six boundary planes with each boundary plane having a corresponding opposite (or parallel) boundary plane such that each set of two boundary planes are orthogonal to the other two sets of boundary planes. Other shapes of volume sections may also be used. FIG. 2 illustrates a plurality of volume sections 22 is two dimensions where each volume section 22 is a rectangular cuboid. Boundaries 23 such as boundary planes separate adjacent volume sections 22. FIG. 3 illustrates a network of ellipsoid-shaped fractures that are cropped into a rectangular cuboid. FIG. 3A illustrates a network of ellipsoid-shaped fractures 31, while FIG. 3B illustrates the network of ellipsoid-shaped fractures 31 cropped into a rectangular cuboid 32. FIG. 4 illustrates a network of rectangular-shaped fractures that are cropped into a rectangular cuboid. FIG. 4A illustrates a network of rectangular-shaped fractures 40. FIG. 4B illustrates the network of rectangular-shaped fractures 40 superimposed with a rectangular cuboid 41. FIG. 4C illustrates a cropped-section 42 (i.e., volume section) of the network of rectangular-shaped fractures 40 cropped with the rectangular cuboid 41. When the DFN is represented as a plurality of volume sections, identifying ma include dividing the DFN into the plurality of volume sections.

Referring to FIG. 1, block 103 calls for identifying fractures that are connected to each other and lead from a first boundary in the plurality of boundaries to a second boundary in the plurality of boundaries to provide one or more flow paths for each volume section. In one or more embodiments, the first boundary and the second boundary are planes that are parallel to each other. In the embodiment where each volume section is a rectangular cuboid, there can be as many as three orthogonal flow paths. For a rectangular cuboid volume section 22 illustrated in FIG. 2, which is a bird view or top view, there is a first flow path 24 that is horizontal with respect to the page, a second flow path 25 that is vertical with respect to the page, and a third flow path 26 that is into the page. For illustration purposes, the first flow path and the second flow path are illustrated as horizontal and vertical, respectively. However, the flow paths follow the outline of the fractures and are not necessarily straight in the horizontal and vertical directions. The first flow path goes from a first boundary 27 to a second boundary 28. Similarly, the second flow path goes from a first boundary 29 to a second boundary 30. Because of the two-dimensional representation, a first boundary and a second boundary for the third flow path 26 are not shown. Techniques for identifying fractures that are connected to each other are known in the art. For example, Provisional U.S. Patent Application No. 62/107,625 filed Jan. 26, 2015, entitled "Directional Permeability Upscaling Of A Discrete Fracture Network," and incorporated herein by reference discloses one such technique.

Referring to FIG. 1, block 104 calls for applying Oda's method to the connected fractures making up the one or more flow paths to estimate the permeability of the earth formation of interest along the one or more flow paths for each volume section to provide a permeability value for each volume section. Vector components of the one or more flow paths may be summed to provide the permeability of the earth formation in each volume section in two orthogonal directions for two-dimensional modelling or in three orthogonal directions for three-dimensional modelling. Hence, applying may include (1) representing each flow path as two orthogonal vector components and the permeability value may include a permeability value corresponding to each of the two vector components or (2) representing each flow path as three orthogonal vector components and the permeability value may include a permeability value corresponding to each of the three vector components.

ODA's method was proposed by M. ODA in 1985. When a rock body contains a sufficient number of fractures, the pressure gradient across the whole flow region inside the rock can be assumed to be linear and written as J. Let $J_i^{(c)}$ be a component of J projected on a fracture, then $$J_i^{(c)} = (\delta_{ij} - n_i n_j) J_i \qquad (1)$$

where $\delta_{ij}$ is the Kronecker delta, $n_i$ are the components of the normal vector of the fracture.

The mean velocity $v_i^{(c)}$ of flow through the fracture has the following expression:

$$v_i^{(c)} = \lambda \frac{g}{v} w^2 J_i^{(c)}. \qquad (2)$$

where $\lambda$ is a dimensionless constant with the range of $0 < \lambda \leq 1/12$, and approaches $1/12$ with increasing size of the related fractures, g is the gravitational acceleration, v is the kinematic viscosity. The permeability $k_{ij}$ of a fracture is related to the apparent seepage velocity $\bar{v}_i$ by:

$$\bar{v}_i = \frac{g}{v} k_{ij} J_j. \qquad (3)$$

If the total volume of a rock body is represented by V, then $\bar{v}_i$ can also be written as:

$$\bar{v}_i = \frac{1}{V} \int v_i^{(c)} dV. \qquad (4)$$

A comparison between equation (2) and (3) leads to the final expression for $k_{ij}$:

$$k_{ij} = \lambda (P_{kk} \delta_{ij} - P_{ij}) \qquad (5)$$

$P_{ij}$, called "crack tensor", is a symmetric, second-order tensor relating only to the crack geometry, and for a fracture of l in length, h in height, and w in width, $$P_{ij} = \frac{1}{V} l h w^3 n_i n_j. \qquad (6)$$

In matrix form, the permeability $K_i$ of the fracture i can be expressed as:

$$K_i = \frac{\lambda}{V} l_i h_i w_i^3 \begin{pmatrix} 1 - n_{i1}^2 & -n_{i1}n_{i2} & -n_{i1}n_{i3} \\ -n_{i1}n_{i2} & 1 - n_{i2}^2 & -n_{i2}n_{i3} \\ -n_{i1}n_{i3} & -n_{i2}n_{i3} & 1 - n_{i3}^2 \end{pmatrix} \qquad (7)$$

where 1, 2 and 3 refer to the three orthogonal directions. For a DFN with m fractures, the permeability $K_t$ can be obtained by superposition:

$$K_t = \Sigma_{i=1}^{m} K_i \qquad (8)$$

This formulation (i.e., Oda's method) alone does not consider fracture connectivity and thus becomes inaccurate for decreasing number of fractures or number of connections.

It can be appreciated that while Oda's method does not consider fracture connectivity, the method 100 as disclosed herein takes into account fracture connectivity and thus provide an estimate of permeability that is more accurate than would be obtained by Oda's method alone.

Referring to FIG. 1, Block 105 calls for performing an action related to the earth formation of interest using the permeability value for each volume section and an apparatus related to the action. Many types of actions may be performed using the estimated permeability of the earth formation of interest. Some of these actions involve running simulations of fluid flow through an earth formation using a reservoir simulator, which in general is commercially available software executed by a processing system. Reservoir simulations model the flow of fluid through a reservoir by solving a set of equations with appropriate initial and boundary conditions, and thus can estimate a production rate for specific time frame. In one or more embodiments, permeability data from block 104 is input into the reservoir simulator. This permeability data may include the location of each volume section and the permeability along one direction or two or three orthogonal directions for the corresponding volume section. One of the benefits of reservoir simulations is to model production scenarios, which can be useful in predicting the performance of green fields (fields with limited or no previous production data), and in predicting and evaluating the benefits of reservoir stimulation efforts. Results from reservoir simulations can contribute significantly to making informed decisions, such as when and where to drill a well, how many wells to drill, and in the early appraisal phase to determine the value of an asset. Accordingly, the method 100 may further include modeling flow of fluid though the earth formation of interest to provide flow values of the fluid using a reservoir simulator implemented by a processor, wherein the permeability value for each volume section is input into the reservoir simulator. Accordingly, the method 100 may further include inputting a location of each volume section into the reservoir simulator.

Three examples of actions related to the earth formation of interest are presented. A first action relates to water flooding of a reservoir to produce oil. During water-flooding, water is injected into an injector well to keep pore pressure elevated, which helps push oil towards the producer well. These operations can be modeled in reservoir simulations. An action based on DFN permeability and reservoir simulations is the selection of injector and producer wells, and the selection and application of water pump rates for certain durations. In one or more embodiments, several scenarios can be run using different pumping rates and corresponding durations. A pumping or injection rate and duration can then be selected from one of the modelled scenarios. In addition, an injection rate and duration may be selected that produces an amount of hydrocarbons in the well that exceeds a threshold value where the threshold value is a minimum value that makes the well economic to produce. Accordingly, the method 100 may further include modeling water injected into the earth formation of interest for different injection rates and durations and estimating an amount of hydrocarbons that are produced in a well penetrating the earth formation of interest. Accordingly, the action may include injecting water into the earth formation of interest at an injection rate and duration that is modelled in the modelling. Accordingly, the action may include injecting water into the earth formation of interest at an injection rate and duration that produces an amount of hydrocarbons in the well that exceeds a threshold value.

A second action relates to well placement in green fields. Operators need to select well locations, a decision which is highly guided by permeability information and reservoir simulation results. By running multiple reservoir simulations each with a different well location, a location can be selected from the simulations that provides for optimal or efficient production of hydrocarbons.

Figure 5A:
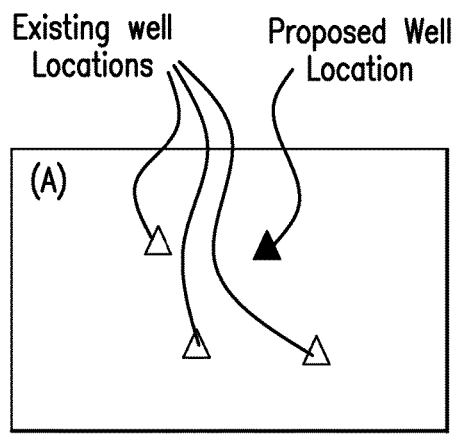
FIGS. 5A-5D, collectively referred to as FIG. 5, depict aspects of selecting a location for infill drilling.
Figure 5B:
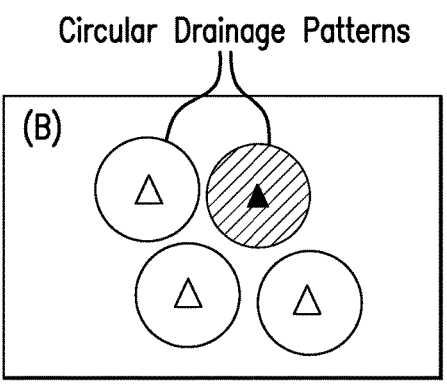
Figure 5C:
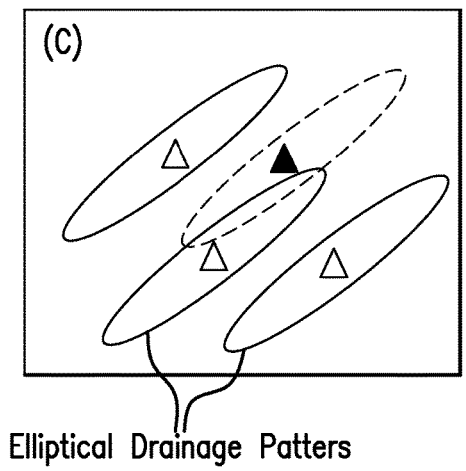
Figure 5D:
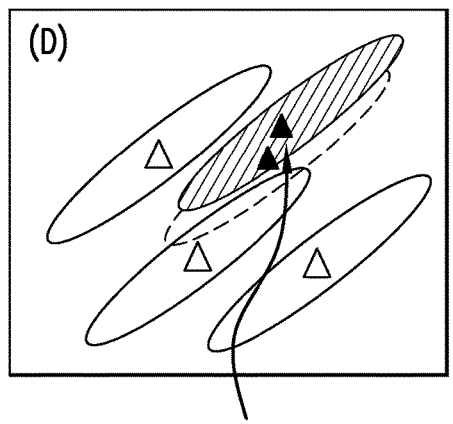

A third example relates to infill drilling, which involves drilling a new well next to existing wells. The decision where to drill the next well strongly depends on the drainage patterns of the existing wells and new wells. If the principal permeabilities in the two lateral directions are equal or similar, a round drainage pattern is expected. Deviations from round towards elliptical shapes occur when principal permeabilities deviate from each other so that permeability is larger in one direction. FIG. 5 in a top or bird view depicts aspects of making an infill drilling decision. Referring to FIG. 5A, given three existing well locations, should the next well be drilled in the proposed location? Referring to FIG. 5B, if the drainage pattern is assumed circular, i.e. no significant differences between two principal permeability directions, then yes. Referring to FIG. 5C, if the drainage pattern is strongly ellipsoid as shown here, due to large differences in two principal permeability directions, then no, because the drainage zone of the proposed well overlaps with that of an existing well. Referring to FIG. 5D, the new well location should be moved to different location so that the drainage patterns or zones do not overlap. Accordingly, the method 100 may further include estimating a drainage pattern of an existing well penetrating the earth formation of interest using the estimated permeability of the earth formation of interest and the action may include drilling a new well at a location where a drainage pattern of the new well does not overlap with the drainage pattern of the existing well.

It can be appreciated that actions of blocks 101-104 and/or 105 discussed above may be embodied as instructions in a computer memory that can be executed by a processor.

Figure 6:
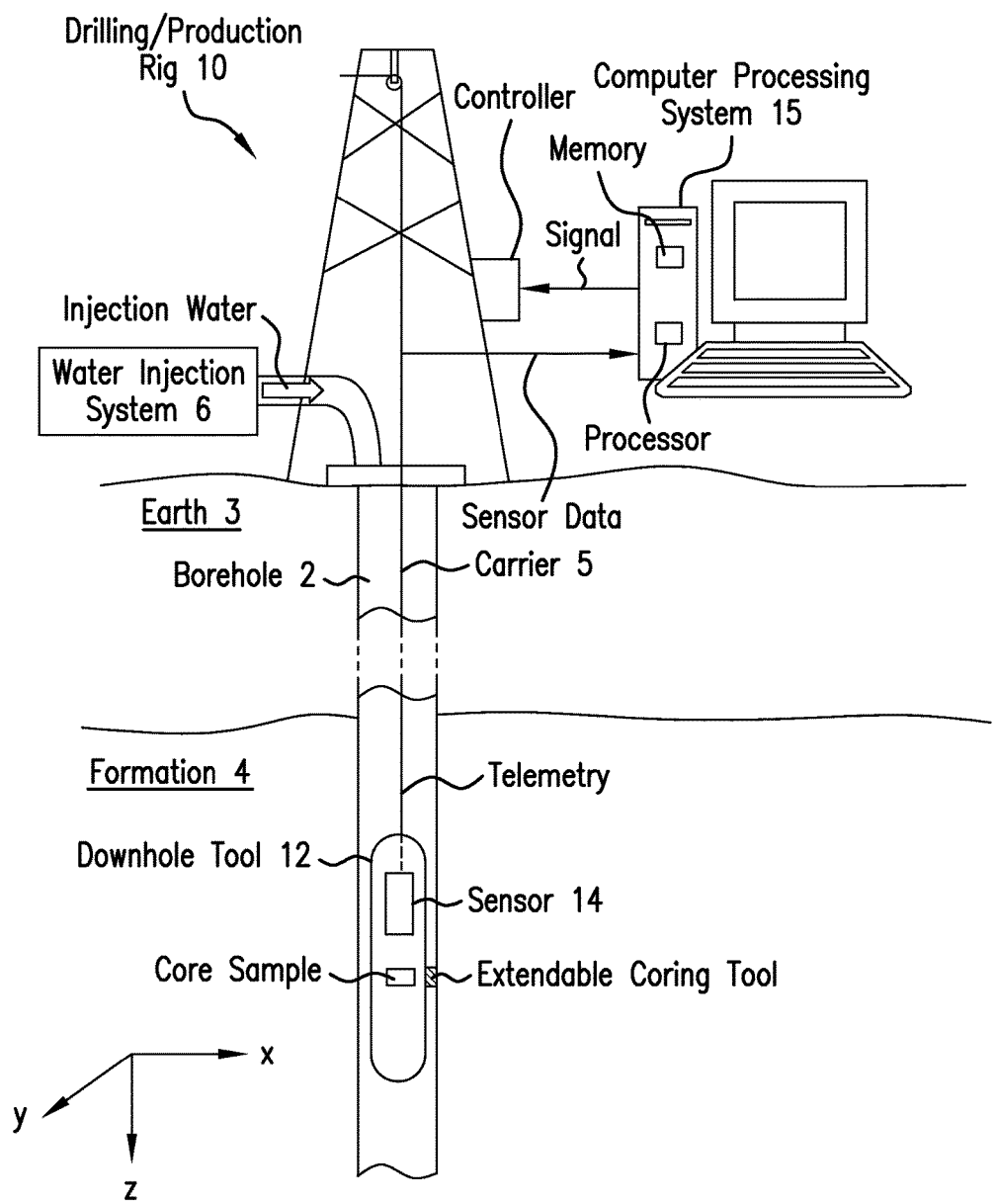
FIG. 6 depicts aspects of a drilling/production rig for drilling a borehole and/or producing hydrocarbons.

Apparatus related to the disclosed method is now discussed. FIG. 6 is a cross-sectional view of a borehole 2 (may also be referred to as a well) penetrating the earth 3 having a formation 4, which contains a reservoir of hydrocarbons. The borehole 2 may be vertical as illustrated in FIG. 6 or deviated or horizontal. A drilling/production rig 10 is configured to drill the borehole 2 and/or perform completion and production actions relating to extracting hydrocarbons from the formation 4. The drilling/production rig 10 includes a controller 11 configured to control various operations performed by the drilling/production rig 10 such as controlling a pumping rate and corresponding duration for water injection purposes. The controller 11 is further configured to receive a signal, such as from a computer processing system 15, providing the controller 11 with instructions, such as a set point or operating curve for example, for controlling the various operations. The computer processing system 15 may also be configured to implement the actions of the method 100 to include running reservoir simulator software.

A carrier 5 such as a drill tubular or drill string for drilling the borehole 2 or an armored wireline for wireline logging embodiments may be disposed in the borehole 2. A downhole tool 12 is conveyed through the borehole by the carrier 5. The downhole tool 12 includes a sensor 14 for sensing a property of the borehole 2 or formation 4. In addition, the downhole tool 12 may be configured to extract a core sample from the formation 4 using an extendable coring tool. The core sample may be analyzed downhole using the sensor 14 to determine one or more properties or parameters of the core sample and thus the formation 4 or it may be analyzed in a laboratory at the surface using micro-photography or X-ray techniques for example. The information determined from the core sample and/or formation logging measurements may be used to determine the DFN of the formation 4. Sensed downhole properties or parameters may be transmitted to the computer processing system 15 using telemetry, which can be the armored wireline, pulsed-mud, or wired drill pipe as non-limiting embodiments.

The drilling production rig 10 may also include a water injection system 6 controllable by the controller 11 for injecting water into the formation 4.

In support of the teachings herein, various analysis components may be used, including a digital and/or an analog system. For example, the drilling/production rig 10, controller 11, the downhole tool 12, the sensor 14, and/or the computer processing system 15 may include digital and/or analog systems. The system may have components such as a processor, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Elements of the embodiments have been introduced with either the articles "a" or "an." The articles are intended to mean that there are one or more of the elements. The terms "including" and "having" are intended to be inclusive such that there may be additional elements other than the elements listed. The conjunction "or" when used with a list of at least two terms is intended to mean any term or combination of terms. The term "configured" relates to one or more structural limitations of a device that are required for the device to perform the function or operation for which the device is configured. The terms "first," "second" and the like are not intended to denote any particular order but are used to distinguish different elements.

The flow diagram depicted herein is just an example. There may be many variations to this diagram or the steps (or operations) described therein without departing from the spirit of the invention. For instance, the steps may be performed in a differing order, or steps may be added, deleted or modified. All of these variations are considered a part of the claimed invention.

While one or more embodiments have been shown and described, modifications and substitutions may be made thereto without departing from the spirit and scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for producing a desired amount of hydrocarbons from an earth formation of interest by estimating a permeability of the earth formation of interest, the method comprising:

conveying a downhole tool through a borehole penetrating the earth formation of interest;

sensing a first property of the earth formation of interest using a sensor disposed on downhole tool;

obtaining a core sample of the earth formation of interest using a coring tool coupled to the carrier;

analyzing the core sample using core analysis apparatus to provide a second property of the earth formation of interest;

generating a discrete fracture network (DFN) of the earth formation of interest based on the first property and the second property;

receiving the DFN of the earth formation of interest, the DFN comprising a location, an orientation, and a size of fractures represented in the earth formation of interest;

representing the DFN as one or more volume sections, each volume section comprising a plurality of boundaries;

identifying fractures that are connected to each other and lead from a first boundary in the plurality of boundaries to a second boundary in the plurality of boundaries to provide one or more flow paths for each volume section;

applying Oda's method to the connected fractures making up the one or more flow paths to estimate the permeability of the earth formation of interest along the one or more flow paths for each volume section to provide a permeability value for each volume section; and entering the permeability value for each volume section into a reservoir simulator implemented by a processor and modeling flow of fluid though the earth formation of interest to provide flow values of the fluid using the reservoir simulator;

modeling water injected into the earth formation of interest for different injection rates and durations and estimating an amount of hydrocarbons that are produced in a well penetrating the earth formation of interest for each modeled injection rate and duration using the reservoir simulator and the flow values; and injecting water into the earth formation of interest using a production rig at an injection rate and duration based on the modeled injection rates and durations to produce a desired amount of hydrocarbons;

wherein the receiving, representing, identifying and applying are performed using a processor.

2. The method according to claim 1, wherein the DFN is represented as a plurality of volume sections and identifying comprises dividing the DFN into the plurality of volume sections.

3. The method according to claim 2, wherein each volume section in the plurality of volume sections is a rectangular cuboid.

4. The method according to claim 1, wherein applying comprises representing each flow path as two orthogonal vector components and the permeability value comprises a permeability value corresponding to each of the two vector components.

5. The method according to claim 1, wherein applying comprises representing each flow path as three orthogonal vector components and the permeability value comprises a permeability value corresponding to each of the three vector components.

6. The method according to claim 1, further comprising inputting a location of each volume section into the reservoir simulator.

7. The method according to claim 1, wherein the desired amount of hydrocarbons in the well exceeds a threshold value.

8. A method for producing a desired flowrate of hydrocarbons from an earth formation of interest by estimating a permeability of the earth formation of interest, the method comprising:

conveying a downhole tool through a borehole penetrating the earth formation of interest:

sensing a first property of the earth formation of interest using a sensor disposed on downhole tool;

obtaining a core sample of the earth formation of interest using a coring tool coupled to the carrier;

analyzing the core sample using core analysis apparatus to provide a second property of the earth formation of interest;

generating a discrete fracture network (DFN) of the earth formation of interest based on the first property and the second property;

receiving the DFN of the earth formation of interest, the DFN comprising a location, an orientation, and a size of fractures represented in the earth formation of interest;

representing the DFN as one or more volume sections, each volume section comprising a plurality of boundaries;

identifying fractures that are connected to each other and lead from a first boundary in the plurality of boundaries to a second boundary in the plurality of boundaries to provide one or more flow paths for each volume section;

applying Oda's method to the connected fractures making up the one or more flow paths to estimate the permeability of the earth formation of interest along the one or more flow paths for each volume section to provide a permeability value for each volume section; and entering the permeability value for each volume section into a reservoir simulator implemented by a processor and modeling flow of fluid though the earth formation of interest to provide flow values of the fluid using the reservoir simulator;

drilling a new well using a drilling rig at a location in the formation of interest that provides a desired flow rate of hydrocarbons into the new well based on the flow values;

wherein the receiving, representing, identifying and applying are performed using a processor.

9. A method for drilling a new well at a location in an earth formation of interest where a drainage pattern of the new well does not overlap with the drainage pattern of an existing well by estimating a permeability of the earth formation of interest, the method comprising:

conveying a downhole tool through a borehole penetrating the earth formation of interest;

sensing a first property of the earth formation of interest using a sensor disposed on downhole tool;

obtaining a core sample of the earth formation of interest using a coring tool coupled to the carrier;

analyzing the core sample using core analysis apparatus to provide a second property of the earth formation of interest;

generating a discrete fracture network (DFN) of the earth formation of interest based on the first property and the second property;

receiving the DFN of the earth formation of interest, the DFN comprising a location, an orientation, and a size of fractures represented in the earth formation of interest;

representing the DFN as one or more volume sections, each volume section comprising a plurality of boundaries;

identifying fractures that are connected to each other and lead from a first boundary in the plurality of boundaries to a second boundary in the plurality of boundaries to provide one or more flow paths for each volume section;

applying Oda's method to the connected fractures making up the one or more flow paths to estimate the permeability of the earth formation of interest along the one or more flow paths for each volume section to provide a permeability value for each volume section; and entering the permeability value for each volume section into a reservoir simulator implemented by a processor and modeling flow of fluid though the earth formation of interest to provide flow values of the fluid using the reservoir simulator;

estimating a drainage pattern of an existing well penetrating the earth formation of interest using the flow values; and drilling a new well using a drilling rig at a location in the earth formation of interest where a drainage pattern of the new well does not overlap with the drainage pattern of the existing well based on the flow values;

wherein the receiving, representing, identifying, applying and estimating are performed using a processor.

10. The method according to claim 7, wherein the threshold value is a minimum value that makes the well economic to produce the hydrocarbons.

11. The method according to claim 8, wherein the desired flow rate of hydrocarbons into the new well exceeds a threshold value.

12. The method according to claim 11, wherein the threshold value is a minimum value that makes the well economic to produce the hydrocarbons.

* * * * *